(12) United States Patent
Yun et al.

(10) Patent No.: US 11,829,210 B2
(45) Date of Patent: Nov. 28, 2023

(54) CIRCUIT BOARD ASSEMBLY AND DISPLAY DEVICE INCLUDING THE SAME

(71) Applicant: SAMSUNG DISPLAY CO., LTD., Yongin-si (KR)

(72) Inventors: Hyoseok Yun, Suwon-si (KR); Taegon Kim, Hwaseong-si (KR); Myoungseop Song, Cheonan-si (KR); Jongmin Shim, Hwaseong-si (KR); Jang-Mi Lee, Hwaseong-si (KR); Kihyun Pyun, Gwangmyeong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/454,512

(22) Filed: Nov. 11, 2021

(65) Prior Publication Data
US 2022/0261049 A1 Aug. 18, 2022

(30) Foreign Application Priority Data
Feb. 17, 2021 (KR) .......................... 10-2021-0021429

(51) Int. Cl.
*G06F 1/18* (2006.01)
*G09G 3/20* (2006.01)

(52) U.S. Cl.
CPC .............. *G06F 1/183* (2013.01); *G06F 1/189* (2013.01); *G09G 3/20* (2013.01); *G09G 2310/0275* (2013.01)

(58) Field of Classification Search
CPC ....................................................... G06F 1/183
USPC ........................................................... 345/55
See application file for complete search history.

(56) References Cited

U.S. PATENT DOCUMENTS

| 2016/0351155 | A1* | 12/2016 | Park | ...................... G09G 3/3696 |
| 2018/0151100 | A1* | 5/2018 | Zhou | ...................... H05K 5/0017 |
| 2020/0402433 | A1* | 12/2020 | Kim | ...................... G01R 31/2896 |

FOREIGN PATENT DOCUMENTS

| KR | 10-0796145 | 1/2008 |
| KR | 10-2011-0014033 | 2/2011 |
| KR | 10-2017-0062636 | 6/2017 |
| KR | 10-2018-0008999 | 1/2018 |

\* cited by examiner

*Primary Examiner* — Long D Pham
(74) *Attorney, Agent, or Firm* — F. CHAU & ASSOCIATES, LLC

(57) ABSTRACT

A circuit board assembly includes a main board and a connection board attached to the main board. The connection board includes a base board including a connecting pad area and a mounting area, wherein the connection board is attached to the main board in the connecting pad area, and wherein the mounting area is spaced apart from the connecting pad area in a first direction and includes a driving chip mounted thereon. The connection board further includes first connection pads disposed on the connecting pad area of the base board, and second connection pads disposed on the connecting pad area of the base board. The main board includes first main pads connected to the first connection pads in a one-to-one connection and a second main pad connected to the second connection pads in a many-to-one connection.

20 Claims, 6 Drawing Sheets

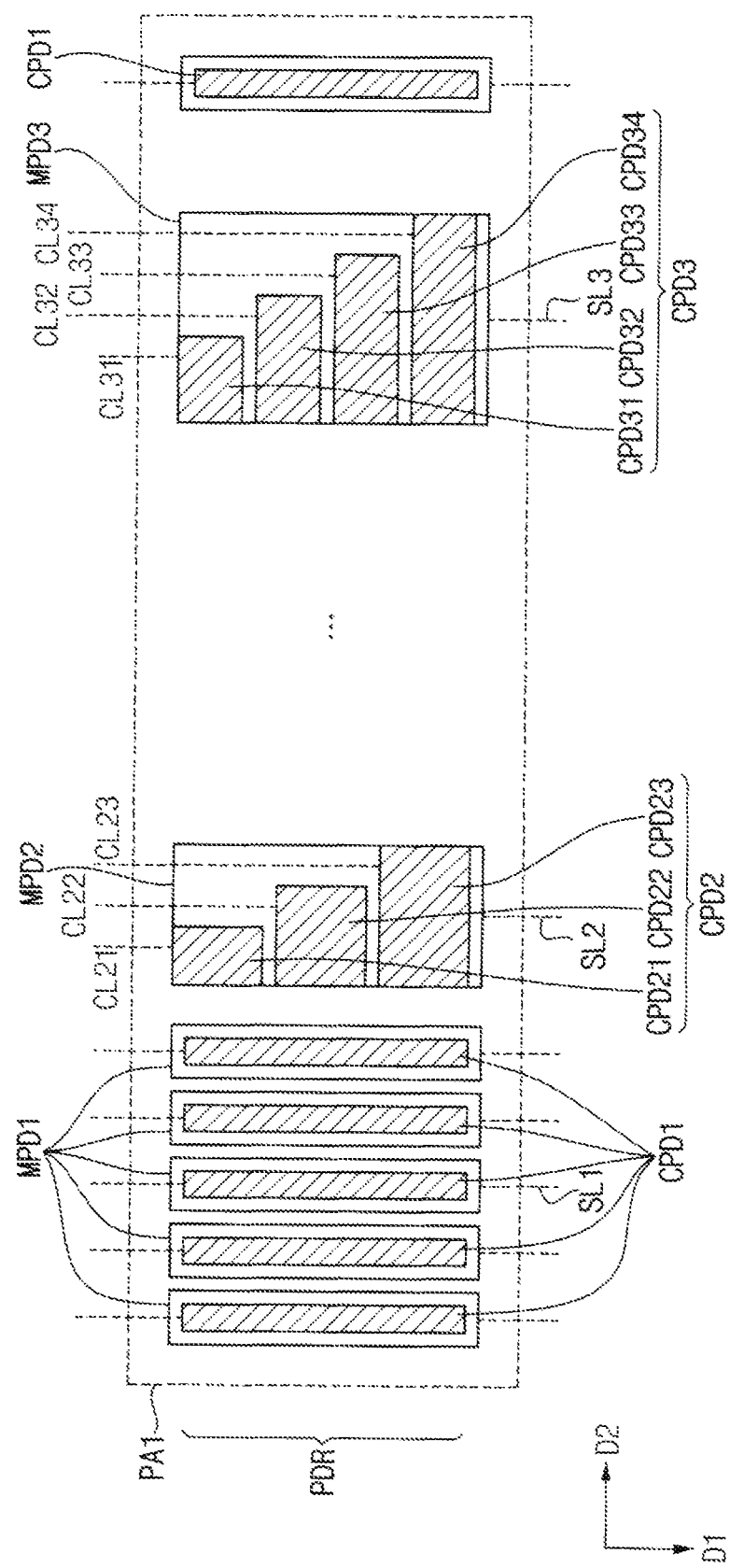

CIRCUIT BOARD ASSEMBLY AND DISPLAY DEVICE INCLUDING THE SAME

CROSS-REFERENCE TO RELATED APPLICATION

This application is based on and claims priority under 35 U.S.C. § 119 to Korean Patent Application No. 10-2021-0021429, filed on Feb. 17, 2021, in the Korean Intellectual Property Office, the disclosure of which is incorporated by reference herein in its entirety.

TECHNICAL FIELD

Embodiments of the present disclosure relate to a circuit board assembly and a display device including the same.

DISCUSSION OF THE RELATED ART

A display device may include a display panel and a display driver configured to drive the display panel. The display driver is generally implemented as an integrated circuit, and provides an interface between one or more processors and the display panel. The display driver may include a data driver and a gate driver, and both the data driver and the gate driver may be mounted on the display panel in a form of a driving chip, or may be mounted on a connection board that is attached to the display panel.

The display device may include a main board that is disposed adjacent to the display panel and configured to supply various signals to the data driver and the gate driver. The main board may be electrically connected to the display panel through the connection board. The main board and the connection board may constitute a circuit board assembly.

A number of pads provided on the connection board and the main board may correspond to the size and/or resolution of the display panel. Accordingly, as display panels are fabricated with increased size and resolution, the number of pads on the connection boards and the main boards of the display panels may increase.

SUMMARY

Some embodiments of the present disclosure provide a circuit board assembly in which contact failure is reduced or prevented.

Some embodiments of the present disclosure provide a display device with increased display quality.

A circuit board assembly according to an embodiment includes a main board and a connection board attached to the main board. The connection board includes a base board including a connecting pad area and a mounting area, wherein the connection board is attached to the main board in the connecting pad area, and wherein the mounting area is spaced apart from the connecting pad area in a first direction and includes a driving chip mounted thereon. The connection board further includes first connection pads disposed on the connecting pad area of the base board; and second connection pads disposed on the connecting pad area of the base board. The main board includes: first main pads connected to the first connection pads in a one-to-one connection; and a second main pad connected to the second connection pads in a many-to-one connection.

According to an embodiment, the second connection pads may be disposed adjacent to each other.

According to an embodiment, the second connection pads may number two to four.

According to an embodiment, each of the second connection pads may receive a same signal from the second main pad.

According to an embodiment, the signal may be a ground.

According to an embodiment, the second connection pads may include a VSS pad and a test pad.

According to an embodiment, the signal may be a contact resistance measurement signal.

According to an embodiment, the signal may be a repair signal.

According to an embodiment, the signal may be a data signal or a gate signal.

According to an embodiment, the connection board may further include third connection pads disposed on the connecting pad area of the base board. The main board may further include a third main pad connected to the third connection pads in a many-to-one connection.

According to an embodiment, the second main pad and the third main pad may be disposed adjacent to each other in a second direction that is perpendicular to the first direction.

According to an embodiment, at least one of the first main pads may be disposed between the second main pad and the third main pad.

According to an embodiment, a length of each of the first main pads in the first direction may be a same as a length of the second main pad in the first direction.

According to an embodiment, a thickness of each of the first main pads in a vertical direction may be a same as a thickness of the second main pad in the vertical direction.

According to an embodiment, the connection board may further include connection lines disposed on the base board. The connection lines may electrically connect each of the first and second connection pads to the driving chip.

According to an embodiment, the first connection pads may be arranged in a second direction perpendicular to the first direction to define a pad row.

According to an embodiment, the second connection pads may be arranged in the first direction within the pad row.

A display device according to an embodiment includes a display panel, a main board, and a connection board attached to the display panel and the main board. The connection board includes a base board including a first connecting pad area, a second connecting pad area, and a mounting area, wherein the connection board is attached to the main board in the first connecting pad area, wherein the connection board is attached to the display panel in the second connecting pad area, and wherein the mounting area is disposed between the first connecting pad area and the second connecting pad area and includes a driving chip mounted thereon. The connection board further includes first connection pads disposed on the first connecting pad area of the base board; and second connection pads disposed on the first connecting pad area of the base board. The main board includes: first main pads connected to the first connection pads in a one-to-one connection; and a second main pad connected to the second connection pads in a many-to-one connection.

According to an embodiment, the second connection pads may be disposed adjacent to each other.

According to an embodiment, the second connection pads may receive a same signal from the second main pad.

The first connection pads may receive various driving signals. The first main pad may be connected in a one-to-one connection with the first connection pads. The second connection pads may receive the same first signal among various driving signals. The second connection pads may be disposed adjacent to each other. The second main pad may be connected to the second connection pads in a many-to-one connection. Accordingly, the possibility that the second main pad is in contact with the first connection pads may be reduced. Accordingly, display quality of a display device including the connection substrate and the main substrate may be increased.

The first connection pads may be arranged in the second direction perpendicular to the first direction to define a pad row. The second connection pads may be arranged in the first direction in the pad row. Accordingly, the utilization of the space of the connection substrate may be increased.

It is to be understood that both the foregoing general description and the following detailed description are directed to examples, and are intended to provide further explanation of the invention as claimed.

BRIEF DESCRIPTION OF THE DRAWINGS

The above and other aspects and features of the present disclosure will be more clearly understood from the following detailed description of embodiments thereof, taken in conjunction with the accompanying drawings, in which:

FIG. 7 is an enlarged view that illustrates an embodiment of a first connecting pad area of FIG. 2.

DETAILED DESCRIPTION

Figure 1:
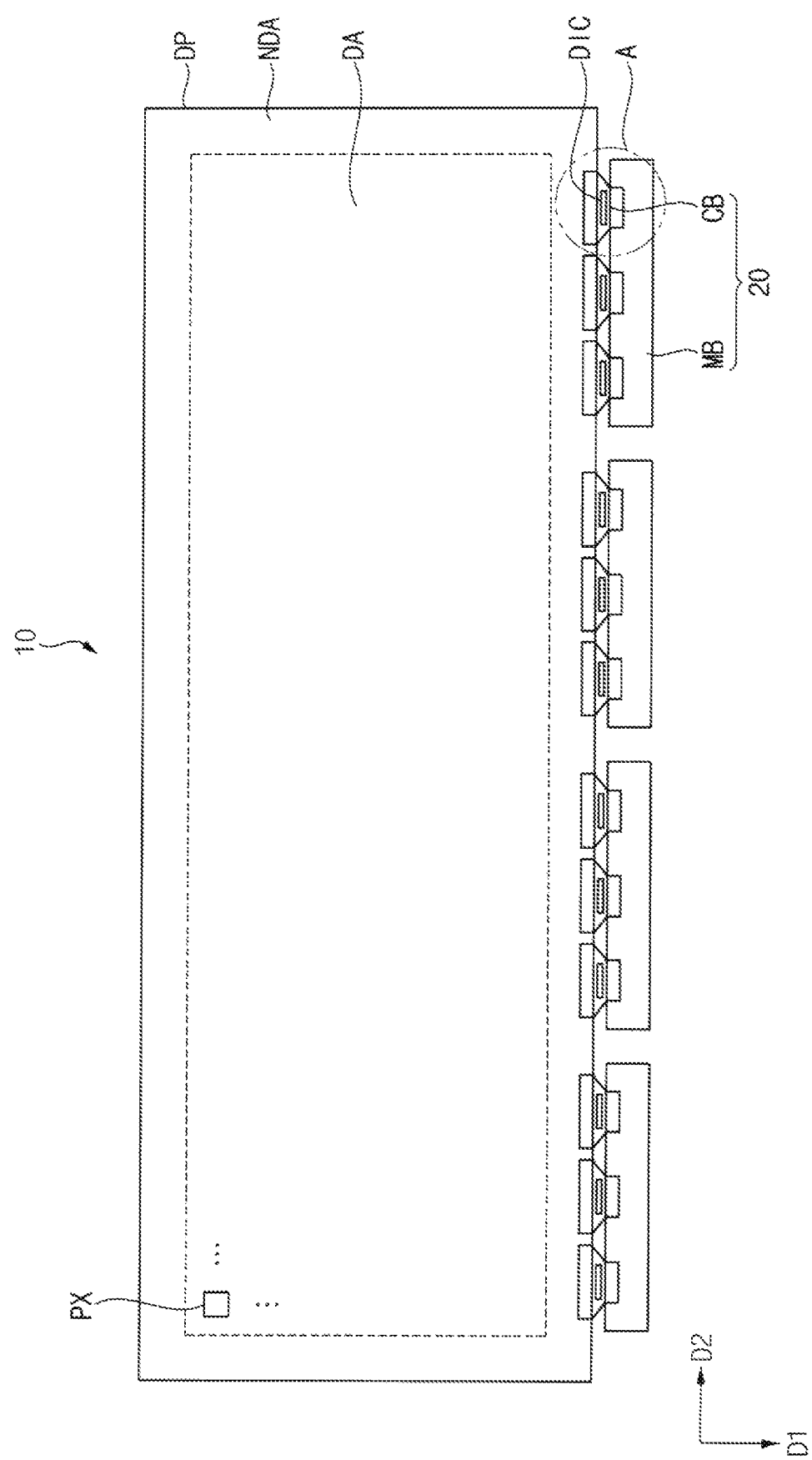
FIG. 1 is a plan view that illustrates a display device according to an embodiment.

Hereinafter, example embodiments will be described in detail with reference to the accompanying drawings. Like reference numerals may refer to like components, and to the extent that a description of an element has been omitted, it may be understood that the element is at least similar to corresponding elements that are described elsewhere in the specification.

FIG. 1 is a plan view that illustrates a display device 10 according to an embodiment.

Referring to FIG. 1, the display device 10 may include a display panel DP, a main board MB, and a connection board CB. The display panel DP may be divided into a display area DA and a non-display area NDA which is adjacent to the display area DA. The display panel DP may have a rectangular shape on a plane that is defined by a first direction D1 and a second direction D2 perpendicular to the first direction D1 (this may be referred to as the "D1-D2" plane). However, the shape of the display panel DP is not necessarily limited thereto. The display panel DP may have various shapes. For example, the display panel DP may have a shape with rounded corners.

A plurality of pixels PX may be disposed in the display area DA. The pixels PX may be entirely arranged in the display area DA in a matrix form. However, this is an example arrangement of the pixels PX, and the pixels PX may be arranged in various forms in the display area DA.

The display device 10 may display an image in the display area DA through the pixels PX.

The display device 10 may be an organic light emitting display device. However, this is only an example, and the display device 10 may be a quantum dot display device, a liquid crystal display device, an electrophoretic display device, a plasma display device, or the like.

Drivers configured to drive the display panel DP may be disposed in the non-display area NDA. The driver(s) may include a gate driver, a light emission driver, a data driver, and/or a timing controller. The non-display area NDA may surround the display area DA on the D1-D2 plane. For example, the non-display area NDA may surround the lateral sides of the display area DA. The non-display area NDA may be bent at a boundary between the display area DA and the non-display area NDA.

The connection board CB may be attached to the display panel DP. For example, the connection board CB may be attached to the non-display area NDA of the display panel DP. The connection board CB may include a flexible film. The connection board CB may include a driving chip DIC disposed on the flexible film. In this case, the display device 10 may have a chip on film structure. However, the present disclosure is not necessarily limited to the chip on film structure. For example, the driving chip DIC may be directly attached to the non-display area NDA of the display panel DP. When the display panel DP includes a glass substrate, the display device 10 may have a chip on glass structure. When the display panel DP includes a plastic substrate, the display device 10 may have a chip on plastic structure. The driving chip DIC may transmit various driving signals to the drivers.

Although FIG. 1 illustrates an example of 12 connection boards CB, the number of connection boards CB is not necessarily limited thereto. Further, though the connection board CB is illustrated as being attached to a lower side of the display panel DP, is the location of the connection board CB is not necessarily limited thereto. The connection board CB may be attached to an upper side, a left side, or a right side of the display panel DP, and the display device 10 may have various numbers of connection boards CB disposed thereon. For example, one connection board CB may be attached to one side of the display panel DP. In this case, the connection board CB may include one driving chip DIC.

The connection board CB may also be attached to the main board MB. The main board MB may convert a command given by a user to the display device 10 into the various driving signals. The various driving signals may be transmitted to the driving chip DIC through the connection board CB. Although the main board MB is illustrated as being attached to three connection boards CB in FIG. 1, the number of connection boards CB attached to the main board MB is not necessarily limited thereto. The main board MB may be attached to various number of connection boards CB. For example, the main board MB may be attached to one connection board CB.

A circuit board assembly 20 may include the main board MB and the connection board CB. For example, the main board MB and the connection board CB may constitute the circuit board assembly 20.

Figure 2:
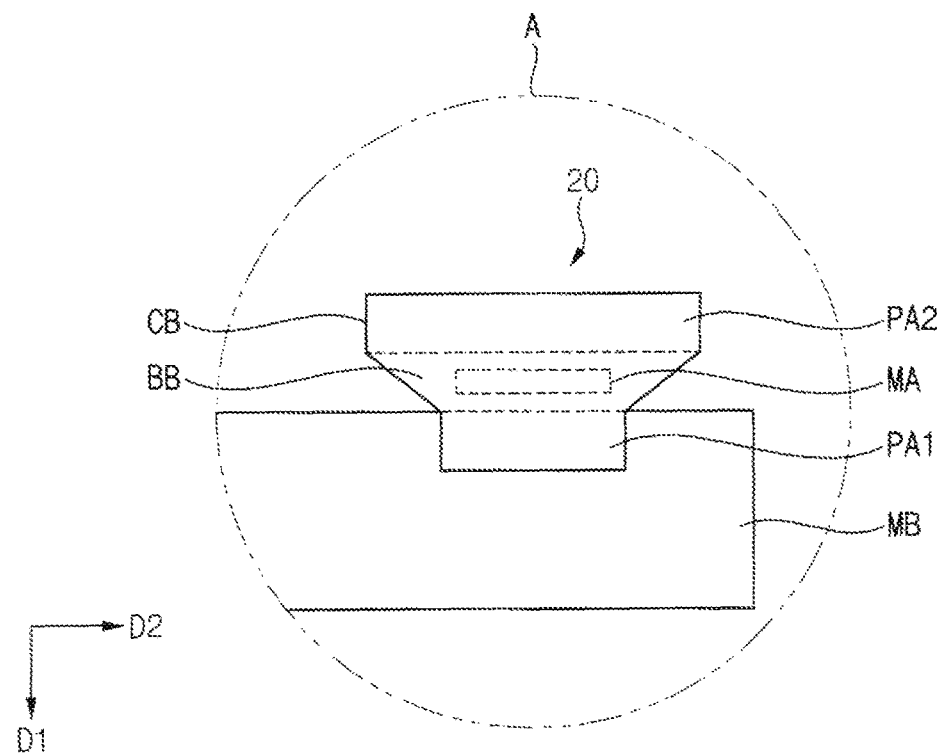
FIG. 2 is an enlarged view that illustrates a portion A of FIG. 1.

FIG. 2 is an enlarged view that illustrates a portion A of FIG. 1.

Referring to FIG. 2, the circuit board assembly 20 according to an embodiment of the present disclosure may include the main board MB and the connection board CB attached to the main board MB. For example, the main board MB may be a printed circuit board (PCB), and the connection board CB may be a flexible film. For example, the circuit board assembly 20 may be a flexible printed circuit board (FPCB). Since a base board BB included in the connection board CB includes a flexible material, the connection board CB may be flexible. Example of the flexible material may include polyimide. In some examples, since the base board BB includes the flexible material, the connection board CB may be bendable, foldable, rollable, or stretchable.

The connection board CB may include the base board BB. The base board BB may include a first connecting pad area PA1, a second connecting pad area PA2, and a mounting area MA. The second connecting pad area PA2 may be spaced apart from the first connecting pad area PA1 in the first direction D1. The mounting area MA may be disposed between the first connecting area PA1 and the second connecting pad area PA2. The connection board CB may be attached to the main board MB in the first connecting pad area PA1. The driving chip DIC may be mounted in the mounting area MA.

The main board MB and the connection board CB may be attached to the first connecting pad area PA1. For example, the main board MB and the connection board CB may be attached to each other in the first connecting pad area PA1 of the connection board CB. The attachment might not only refer to adhesion. For example, the attachment may mean an electrical connection. In order to electrically connect the main board MB and the connection board CB to each other, the main board MB may include a main pad, and the connection board CB may include a connection pad. The main pad and the connection pad may be connected to each other so that the main board MB and the connection board CB may be electrically connected. For example, by disposing an anisotropic conductive film that includes conductive particles between the main pad and the connection pad, the main pad and the connection pad may be connected.

The anisotropic conductive film may be a double-sided tape material that includes an adhesive cured by heat. The adhesive may have conductive particles dispersed throughout the adhesive. When a pressure is applied to the anisotropic conductive film, the conductive particles disposed at a portion where the main pad and the connection pad contact each other may be destroyed. The destroyed conductive particles may electrically connect the main pad and the connection pad. For example, the conductive particles may be fractured, thereby forming electrical pathways. The adhesive may be cured by applying high-temperature heat to the anisotropic conductive film so that the conductive particles are fixed and the main pad and the connection pad are adhered to each other. Accordingly, the anisotropic conductive film may attach the main board MB and the connection board CB to each other. The connection pad will be described in detail with reference to FIG. 3, and the main pad will be described with reference to FIG. 4.

Figure 3:
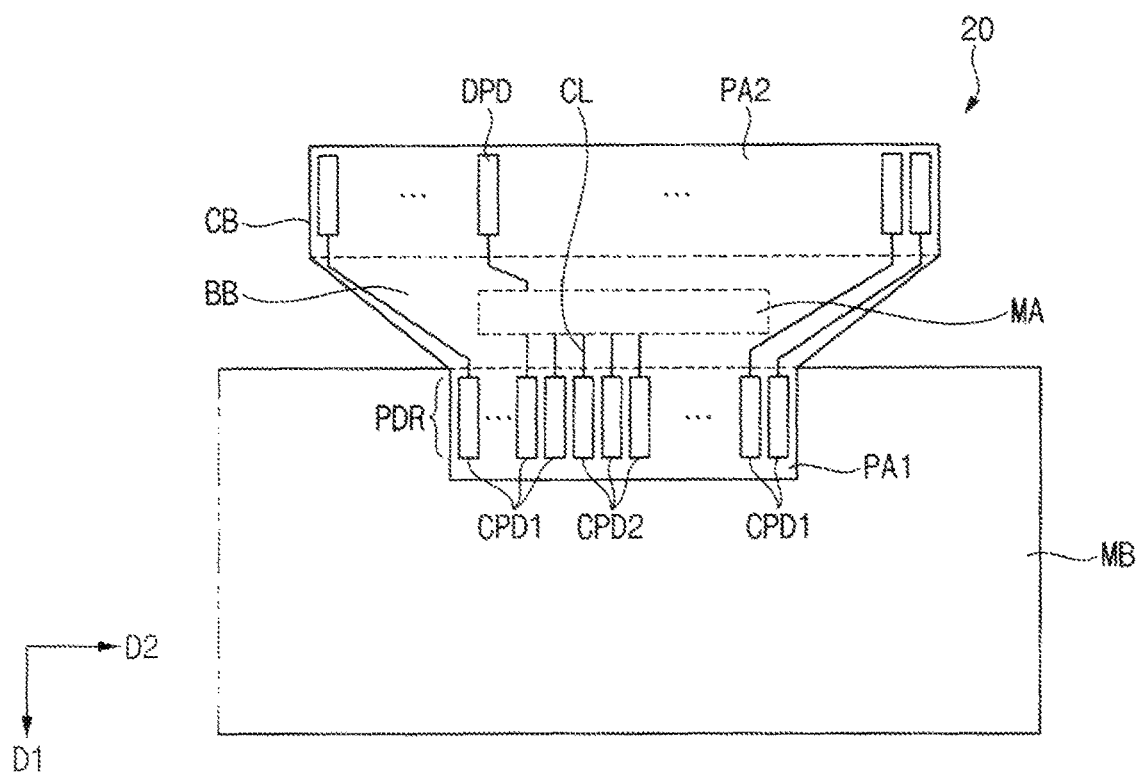
FIG. 3 is a plan view that illustrates a connection board of FIG. 2.

FIG. 3 is a plan view that illustrates a connection board CB of FIG. 2.

Referring to FIG. 3, the connection board CB may further include a plurality of connection pads. In an embodiment, the connection board CB may include the base board BB, first connection pads CPD1, and second connection pads CPD2. The first connection pads CPD1 and the second connection pads CPD2 may be disposed on the first connecting pad area PA1.

The first connection pads CPD1 may be arranged in the second direction D2 to define a pad row PDR. The second connection pads CPD2 may be arranged in the second direction D2 in the pad row PDR. For example, the first and second connection pads CPD1 and CPD2 may be arranged in the second direction D2 in the same pad row PDR.

In some embodiments, the plurality of connection pads disposed in the first connecting pad area PA1 may be arranged in a plurality of rows. For example, the connection pads may be arranged in first to third rows spaced apart from each other in the first direction D1. The connection pads may be arranged in the second direction D2 in the first to third rows. The first and second connection pads CPD1 and CPD2 may be arranged in the second direction D2 within the pad row PDR, where the pad row PDR is any one of the first to third rows.

A thickness of each of the first connection pads CPD1 may be the same as a thickness of each of the second connection pads CPD2. For example, a thickness of each of the first connection pads CPD1 in a vertical direction D3 may be the same as a thickness of each of the second connection pads CPD2. A length of each of the first connection pads CPD1 in the first direction D1 may be the same as a length of each of the second connection pads CPD2 in the first direction D1. A width of each of the first connection pads CPD1 in the second direction D2 may be the same as a width of each of the second connection pads CPD2 in the second direction D2. A distance between the first connection pads CPD1 may be the same as a distance between the second connection pads CPD2. For example, a distance between adjacent first connection pads CPD1 among the first connection pads CPD1 may be the same as a distance between adjacent connection pads CPD2 among the connection pads CPD2.

The second connection pads CPD2 may be adjacent to each other. For example, the second connection pads CPD2 may be disposed in a group without other pads or components interposed between them. The number of second connection pads CPD2 may be two to four. However, the number of the second connection pads CPD2 is not necessarily limited thereto.

The connection board CB may further include a connection line CL. The connection line CL may be disposed on the base board BB. The connection line CL may electrically connect each of the first and second connection pads CPD1 and CPD2 to the driving chip DIC. The first and second connection pads CPD1 and CPD2 may transmit the various driving signals to the driving chip DIC through the connection line CL.

The connection board CB may further include a plurality of display pads DPD disposed on the second connecting pad area PA2 of the base board BB. Each of the display pads DPD may be electrically connected to the driving chip DIC, the first connection pads CPD1, and/or the second connection pads CPD2.

The display pads DPD of the connection board CB may be electrically connected to panel pads of the display panel DP. The display panel DP and the connection board CB may be connected to each other by disposing an anisotropic conductive film between the display pads DPD and the panel pads. The main board MB may convert a command given by the user of the display device 10 to the display device 10 into various driving signals. The various driving signals may be transmitted to the display panel DP through the connection board CB. The display device 10 may display an image desired by the user. For example, the display device 10 may display an image in response to a command given by the user to the display device 10.

The first and second connection pads CPD1 and CPD2 may be connected to the main pads of the main board MB to receive the various driving signals. In a comparative example, each of the connection pads is connected to each of the main pads. However, as will be described further below, a one-to-one connection of the connection pads to the main pads may be disadvantageous for display panel design.

As the size of the display panel DP increases and the resolution increases, the number of required connection pads increases. However, to accommodate an increased number of connection pads, the size of the connection board CB may also have to be increased. A large connection board CB will result in increased weight and production cost. Further, the connection pads are arranged in a limited space.

Further, during fabrication of a display panel, the connection board CB may be manufactured by a fine process while the main board MB might not be manufactured by a fine process due to problems such as production cost. A "fine" process may refer to a fabrication process that is designed to produce smaller components, circuits, or pads with increased accuracy. Accordingly, in a comparative example, contact failure may occur between the connection board CB and the main board MB when the respective main pads are connected to the respective connection pads one-to-one during manufacturing. For example, a main pad transmitting a first signal among the driving signals may be connected to a first connection pad receiving the first signal, but also may be connected to a second connection pad receiving a second signal different from the first signal at the same time. Accordingly, the display quality of the display device 10 in a comparative example is deteriorated.

Figure 4:
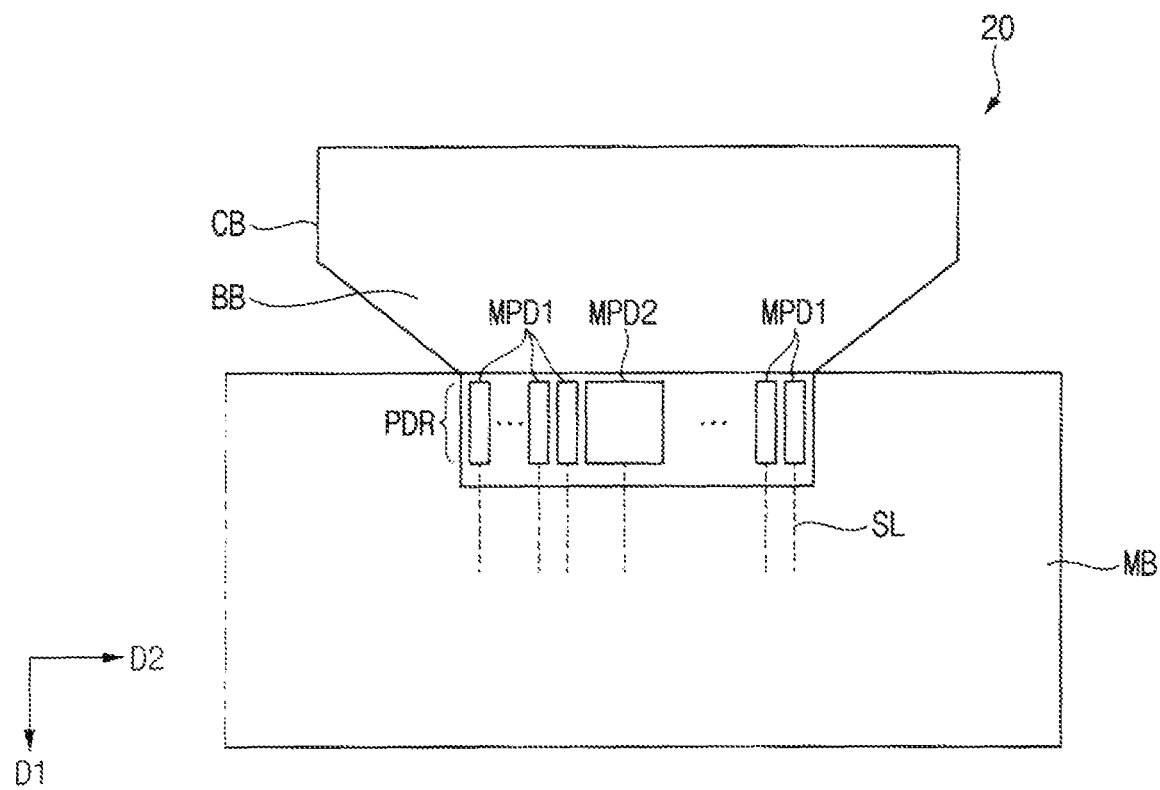
FIG. 4 is a plan view that illustrates a main board of FIG. 2.

FIG. 4 is a plan view that illustrates a main board MB of FIG. 2.

Referring to FIG. 4, the main board MB may include a plurality of first main pads MPD1 and a second main pad MPD2. The first main pads MPD1 may be connected one-to-one with the first connection pads CPD1. The second main pad MPD2 may be connected many-to-one with the second connection pads CPD2. For example, each of the first connection pads CPD1 and may be connected to each of the first main pads MPD1 in a one-to-one arrangement. For example, a plurality of second connection pads CPD2 may be connected to one second main pad MPD2 in a many-to-one arrangement. As used herein, the phrase "many-to-one connection" describes an arrangement in which a plurality of second connection pads, for example, are connected to one second main pad. The main board MB may include a signal line SL for transmitting the various driving signals to the first main pads MPD1 and the second main pad MPD2.

A thickness of each of the first main pads MPD1 may be the same as a thickness of the second main pad MPD2. For example, a thickness of each of the first main pads MPD1 in the third direction D3 (e.g., a vertical direction) may be the same as a thickness of the second main pad MPD2. A length of each of the first main pads MPD1 in the first direction D1 may be the same as a length of the second main pad MPD2 in the first direction D1. A width of each of the first main pads MPD1 in the second direction D2 may be smaller than a width of the second main pad MPD2 in the second direction D2.

The main board MB may include a glass substrate, a quartz substrate, a plastic substrate, or the like.

Referring to FIGS. 3 and 4, each of the first main pads MPD1 is illustrated as having the same size as each of the first connection pads CPD1 on the D1-D2 plane, but is not necessarily limited thereto. For example, the size of each of the first main pads MPD1 may be sufficient if they overlap each of the first connection pads CPD1 on the D1-D2 plane and are connected one-to-one and not many-to-one. The size of the second main pad MPD2 may be sufficient if it overlaps with the second connection pads CPD2 on the D1-D2 plane and is connected in a many-to-one, and does not overlap with the first connection pads CPD1 on the D1-D2 plane. The second main pad MPD2 may have a smaller size on the D1-D2 plane than illustrated. In this case, a distance between each of the first main pads MPD1 and the second main pad MPD2 may be increased. This may reduce the probability of contact between the first main pads MPD1 and the second main pad MPD2. Accordingly, the display quality of the display device 10 may be increased.

Each of the first main pads MPD1 may transmit various driving signals to each of the first connection pads CPD1 which are connected one-to-one to each of the first main pads MPD1. The second main pad MPD2 may transmit the various driving signals to the plurality of second connection pads CPD2 connected in a many-to-one arrangement to the second main pad MPD2. Each of the second connection pads CPD2 may receive a same signal from the second main pad MPD2.

In an embodiment, the same signal may be a ground signal. When the same signal is a ground signal, the second connection pads CPD2 may include a VSS pad and a test pad. For example, the second connection pads CPD2 may include a VSS pad, a first test pad, a second test pad, and a third test pad.

In an embodiment, the same signal may be a contact resistance measurement signal. When the same signal is a contact resistance measurement signal, the second connection pads CPD2 may include contact resistance measurement pads.

In an embodiment, the same signal may be a repair signal. When the same signal is a repair signal, the second connection pads CPD2 may include repair pads.

In an embodiment, the same signal may be a data signal or a gate signal. When the same signal is a data signal or a gate signal, the second connection pads CPD2 may include data pads or gate pads.

However, the same signal transmitted by the second main pad MPD2 is not necessarily limited to the aforementioned signals, and the same signal may be various signals. For example, the same signal may be a scan signal, a clock signal, or the like.

The second connection pads CPD2 may be adjacent to each other. The second main pad MPD2 may have a simple shape. For example, the second main pad MPD2 may have a rectangular shape that overlaps all of the second connection pads CPD2.

The connection board CB may include the second connection pads CPD2 which are adjacent to each other and which receive the same signal from the main board MB. The main board MB may include a second main pad MPD2 connected to the second connection pads CPD2 in a many-to-one arrangement. Accordingly, a contact failure between the second main pad MPD2 and the first connection pads CPD1 may be reduced or prevented.

Figure 5:
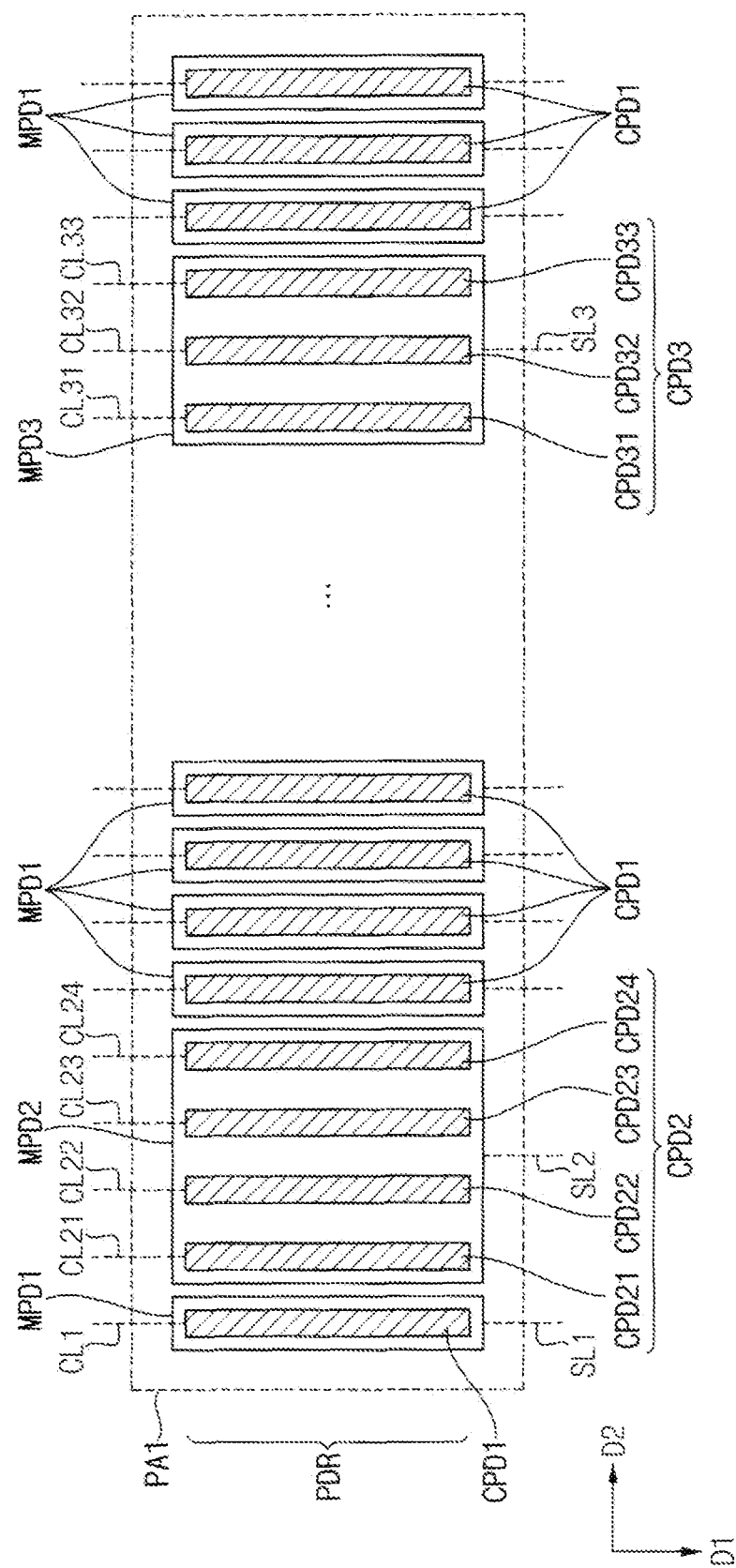
FIG. 5 is an enlarged view that illustrates an embodiment of a first connecting pad area of FIG. 2.

FIG. 5 is an enlarged view that illustrates an embodiment of a first connecting pad area PA1 of FIG. 2.

Referring to FIG. 5, the connection board CB may further include third connection pads CPD3 disposed on the first connecting pad area PA1 of the base board BB. The main board MB may further include a third main pad MPD3 connected to the third connection pads CPD3 in a one-to-many arrangement; for example, there may be more than one third connection pads CPD3 connected to one third main pad MPD3.

The third connection pads CPD3 may be arranged in the second direction D2 in the pad row PDR in which the first and second connection pads CPD1 and CPD2 are arranged. Each of the first to third connection pads CPD1, CPD2, and CPD3 may be arranged in the second direction D2 with a predetermined width and a predetermined interval. For example, each of the first to third connection pads CPD1, CPD2, and CPD3 may be arranged with a predetermined spacing in the second direction D2.

A thickness of each of the third connection pads CPD3 may be the same as a thickness of each of the first and second connection pads CPD1 and CPD2. For example, a thickness of each of the third connection pads CPD3 in the third direction (e.g., a vertical direction) may be the same as a thickness of each of the first and second connection pads CPD1 and CPD2 in the third direction. A length of each of the third connection pads CPD3 in the first direction D1 may be the same as a length of each of the first and second connection pads CPD1 and CPD2 in the first direction D1. A width of each of the third connection pads CPD3 in the second direction D2 may be the same as a width of each of the first and second connection pads CPD1 and CPD2 in the second direction D2. A distance between the third connection pads CPD3 in the second direction D2 may be the same as a distance between the first and second connection pads CPD1 and CPD2 in the second direction D2. For example, the third connection pads CPD3 may be spaced apart at a same distance interval at which each of the first and second connection pads CPD1 and CPD2 are spaced apart. Each of the first to third connection pads CPD1, CPD2, and CPD3 may have substantially the same size and shape.

The first connection pads CPD1 may be disposed adjacent to each other or the first connection pads CPD1 may be spaced apart from each other. For example, there may be other pads disposed between some of the first connection pads CPD1 in the pad row PDR. The second connection pads CPD2 may be adjacent to each other. The third connection pads CPD3 may be adjacent to each other.

The number of second connection pads CPD2 may be two to four, and the number of third connection pads CPD3 may be two to four. However, the number of the second and third connection pads CPD2 and CPD3 is not necessarily limited.

In an embodiment, the second connection pads CPD2 may include a (2-1) connection pad CPD21, a (2-2) connection pad CPD22, a (2-3) connection pad CPD23, and a (2-4) connection pad CPD24. The third connection pads CPD3 may include a (3-1) connection pad CPD31, a (3-2) connection pad CPD32, and a (3-3) connection pad CPD33.

The main board MB may include first main pads MPD1, a second main pad MPD2, and a third main pad MPD3. The first main pads MPD1 may be connected to the first connection pads CPD1 in a one-to-one arrangement. The second main pad MPD2 may be connected to the second connection pads in a CPD2 many-to-one arrangement. The third main pad MPD3 may be connected to the third connection pads CPD3 in a many-to-one arrangement. The first main pads MPD1 may receive various driving signals through the first signal line SL1. The second main pad MPD2 may receive a first signal among the driving signals through the second signal line SL2. The third main pad MPD3 may receive a second signal among the driving signals through the third signal line SL3.

A length of each of the first main pads MPD1 in the first direction D1 may be the same as a length of the second main pad MPD2 in the first direction D1 and a length of the third main pad MPD3 in the first direction D1. A thickness of each of the first main pads MPD1 may be the same as a thickness of the second main pad MPD2 and a thickness of the third main pad MPD3. However, a width of each of the first main pads MPD1 in the second direction D2 may be less than a width of the second main pad MPD2 in the second direction D2 and less than a width of the third main pad MPD3 in the second direction D2.

For convenience of description, the first main pads MPD1 are illustrated to be larger than the first connection pads CPD1. The second main pad MPD2 is illustrated to be larger than the group of second connection pads CPD2. The third main pad MPD3 is illustrated to be larger than the group of third connection pads CPD3. However, the present disclosure is not necessarily limited thereto.

In an example embodiment, the first main pads MPD1 may overlap the first connection pads CPD1, and might not overlap the second main pad MPD2 and the third main pad MPD3. The second main pad MPD2 may overlap the second connection pads CPD2, and might not overlap the first main pads MPD1 and the third main pad MPD3. The third main pad MPD3 may overlap the third connection pads CPD3, and might not overlap the first main pads MPD1 and the second main pad MPD2.

As used herein, the phrase "many-to-one connection" describes an arrangement in which a plurality of second connection pads, for example, are connected to one second main pad. In an example operation of the display device 10, each of the second connection pads CPD2 may receive the same first signal from the second main pad MPD2. Each of the third connection pads CPD3 may receive the same second signal from the third main pad MPD3. Since the many (e.g., more than one) second connection pads CPD2 receive the same first signal from the second main pad MPD2, the second main pad MPD2 may have a many-to-one connection with the second connection pads CPD2. Since the many (e.g., more than one) third connection pads CPD3 receive the same second signal from the third main pad MPD3, the third main pad MPD3 may have a many-to-one connection with the third connection pads CPD3. The first signal and the second signal may be different, or the first signal and the second signal may be the same. For example, it may be sufficient for the plurality of second connection pads CPD2 to receive the same signal from the second main pad MPD2. It may be sufficient for plurality of the third connection pads CPD3 to receive the same signal from the third main pad MPD3. For example, the each of the second connection pads CPD2 or each of the third connection pads CPD3 might not each require a different signal at a particular instant in time; accordingly, it may be sufficient for the plurality of second connection pads CPD2 to receive the same signal from the second main pad MPD2 and/or for the plurality of third connection pads CPD3 to receive the same signal from the third main pad MPD3.

In an embodiment, the first and second signals may be ground signals. When the first and second signals are ground signals, the second and third connection pads CPD2 and CPD3 may include a VSS pad and a test pad. For example, the second and third connection pads CPD2 and CPD3 may be a VSS pad, a first test pad, a second test pad, and a third test pad.

In an embodiment, the first and second signals may be contact resistance measurement signals. When the first and second signals are contact resistance measurement signals, the second and third connection pads CPD2 and CPD3 may include contact resistance measurement pads.

In an embodiment, the first and second signals may be repair signals. When the first and second signals are repair signals, the second and third connection pads CPD2 and CPD3 may include repair pads.

In an embodiment, the first and second signals may be a data signal or a gate signal. When the first and second signals are data signals or gate signals, the second and third connection pads CPD2 and CPD3 may include data pads or gate pads.

However, the first and second signals are not necessarily limited to the aforementioned signals, and the first and second signals may be various signals. For example, the first and second signals may be a scan signal, a clock signal, or the like.

Each of the first main pads MPD1 may receive various driving signals through a first signal line SL1. The first connection line CL1 may transmit the various driving signals to the display pads DPD through each of the first connection pads CPD1 connected to the respective first main pads MPD1.

The second main pad MPD2 may receive the first signal through a second signal line SL2. The second main pad MPD2 may transmit the first signal to the second connection pads CPD2. Each of the (2-1) connection line CL21, the (2-2) connection line CL22, the (2-3) connection line CL23, and the (2-4) connection line CL24 may transmit the first signal to the display pads DPD through each of the second connection pads CPD21, CPD22, CPD23, and CPD24 connected to the second main pad MPD2.

The third main pad MPD3 may receive the second signal through a third signal line SL3. The third main pad MPD3 may transmit the second signal to the third connection pads CPD3. Each of the (3-1) connection line CL31, the (3-2) connection line CL32, and the (3-3) connection line CL33 may transmit the second signal to the display pads DPD through each of the third connection pads CPD31, CPD32, and CPD33 connected to the third main pad MPD3.

At least one of the first main pads MPD1 may be disposed between the second main pad MPD2 and the third main pad MPD3. For example, the second main pad MPD2 and the third main pad MPD3 might not be disposed adjacent to each other in the second direction D2.

The first to third connection pads CPD1, CPD2, and CPD3 may receive various driving signals. The second connection pads CPD2 may receive the same first signal, and the third connection pads CPD3 may receive the same second signal. The second connection pads CPD2 which receive the first signal may be adjacent to each other, and the third connection pads CPD3 which receive the second signal may be adjacent to each other. The second main pad MPD2 may be connected to the second connection pads CPD2 receiving the first signal in a many-to-one connection, and the third main pad MPD3 may be connected to the third connection pads CPD3 receiving the second signal in a many-to-one connection.

Accordingly, a contact failure between the connection pads and the main pads may be reduced or prevented compared to a comparative example in which there is a one-to-one connection between the connection pads and the main pads. For example, the main board MB which is not manufactured according to a fine process may include the main pads corresponding to the connection pads of the connection board CB which has been manufactured through the fine process. For example, even though the main board is not manufactured according to a fine process, the many-to-one arrangement of the connection pads to the main pads according to embodiments of the present disclosure may prevent or reduce contact failures between the main board MB and the connection board CB. Accordingly, the display quality of the display device 10 may be increased.

Figure 6:
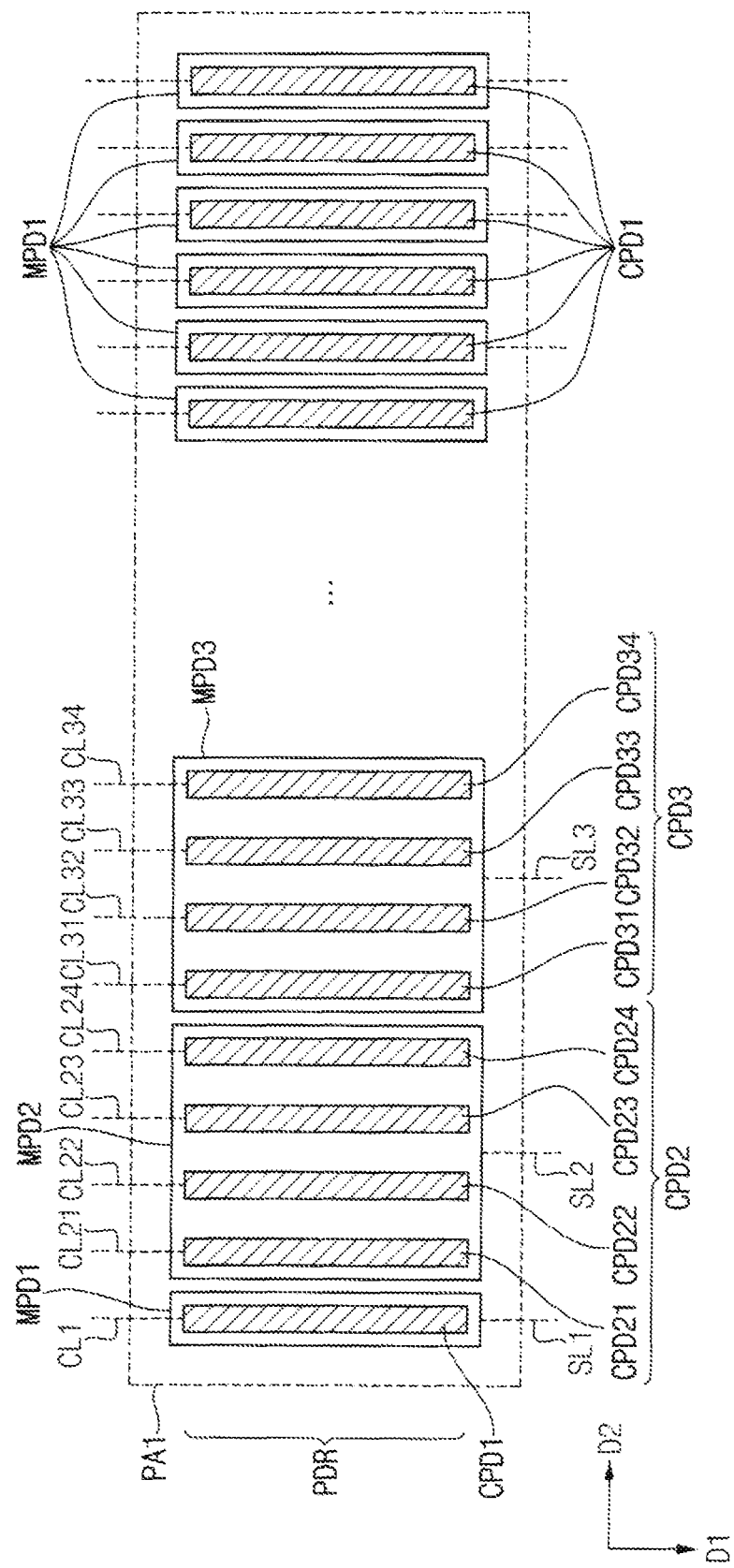
FIG. 6 is an enlarged view that illustrates an embodiment of a first connecting pad area of FIG. 2.

FIG. 6 is an enlarged view that illustrates an embodiment of a first connecting pad area PA1 of FIG. 2. The same reference numerals are used for the same components as those shown in FIG. 5, and to the extent that a description of an element has been omitted, it may be understood that the element is at least similar to corresponding elements that are described elsewhere in the specification.

Referring to FIG. 6, the second main pad MPD2 and the third main pad MPD3 may be disposed adjacent to each other in the second direction D2. In this example, the first main pads MPD1 are not be disposed between the second main pad MPD2 and the third main pad MPD3.

The second main pad MPD2 may receive the first signal through the second signal line SL2. The third main pad MPD3 may receive the second signal different from the first signal through the third signal line SL3. Even if the second main pad MPD2 and the third main pad MPD3 are disposed adjacent to each other, the second main pad MPD2 and the third main pad MPD3 might not be formed as one main pad. In an example, when the first signal and the second signal are the same signal, unlike in FIG. 6, only one main pad connected to both the second connection pads CPD2 and the third connection pads CPD3 may be formed.

FIG. 7 is an enlarged view that illustrates an embodiment of a first connecting pad area of FIG. 2.

Referring to FIG. 7, the first connection pads CPD1 may be arranged in the second direction D2 perpendicular to the first direction D1 to define the pad row PDR. The second and third connection pads CPD2 and CPD3 may be arranged in the first direction D1 in the same pad row PDR. For example, the second and third connection pads CPD2 and CPD3 might not be arranged in the first to third rows arranged in the first direction D1. The second and third connection pads CPD2 and CPD3 may be arranged in the first direction D1 within the pad row PDR, where the pad row PDR is any one of the first to third rows.

In an embodiment, the second connection pads CPD2 may include a (2-1) connection pad CPD21, a (2-2) connection pad CPD22, and a (2-3) connection pad CPD23. The third connection pads CPD3 may include a (3-1) connection pad CPD31, a (3-2) connection pad CPD32, a (3-3) connection pad CPD33, and a (3-4) connection pad CPD34.

Since the second connection pads CPD2 may receive the same first signal from the second main pad MPD2, the second main pad MPD2 may be electrically connected to one second signal line SL2. Since the third connection pads CPD3 may receive the same second signal from the third main pad MPD3, the third main pad MPD3 may be electrically connected to one third signal line SL3.

The (2-1) connection pad CPD21, the (2-2) connection pad CPD22, and the (2-3) connection pad CPD23 may each be electrically connected to other display pads DPD. The (2-1) connection pad CPD21 may be connected a (2-1) connection line CL21, the (2-2) connection pad CPD22 may be connected a (2-2) connection line CL22, and the (2-3) connection pad CPD23 may be connected a (2-3) connection line CL23. The (3-1) connection pad CPD31, the (3-2) connection pad CPD32, the (3-3) connection pad CPD33, and the (3-4) connection pad CPD34 may each be electrically connected to other display pads DPD. The (3-1) connection pad CPD31 may be connected a (3-1) connection line CL31, the (3-2) connection pad CPD32 may be connected a (3-2) connection line CL32, the (3-3) connection pad CPD33 may be connected a (3-3) connection line CL33, and the (3-4) connection pad CPD34 may be connected a (3-4) connection line CL34.

In order not to make contact between the connection lines CL, each of the second connection pads CPD2 may have different sizes, and each of the third connection pads CPD3 may have different sizes.

A length of the (2-1) connection pad CPD21, a length of the (2-2) connection pad CPD22, and a length of the (2-3) connection pad CPD23 may each be different from each other. A width of the (2-1) connection pad CPD21, a width of the (2-2) connection pad CPD22, and a width of the (2-3) connection pad CPD23 may each be different from each other. A length of the (3-1) connection pad CPD31, a length of the (3-2) connection pad CPD32, a length of the (3-3) connection pad CPD33, and a length of the (3-4) connection pad CPD34 may each be different from each other. A width of the (3-1) connection pad CPD31, a width of the (3-2) connection pad CPD32, a width of the (3-3) connection pad CPD33, and a width of the (3-4) connection pad CPD34 may each be different from each other.

As the second and third connection pads CPD2 and CPD3 are arranged in the first direction D1 in the pad row PDR, space utilization of the connection board CB may be increased. Since the second and third connection pads CPD2 and CPD3 are arranged in the first direction D1 in the pad row PDR in a limited space, a sufficient distance between the first connection pads CPD1 may be secured. For example, a distance between each of the first connection pads CPD1 and the second connection pads CPD2 and a distance between each of the first connection pads CPD1 and the third connection pads CPD3 may be sufficiently secured.

In embodiments of the present disclosure, it is sufficient for the second and third main pads MPD2 and MPD3 to be connected to the second and third connection pads CPD2 and CPD3 in a many-to-one connection, and to not be connected to the first connection pads CPD1. The second and third connection pads CPD2 and CPD3 are arranged in the first direction D1 in the pad row PDR, so that a sufficient distance between the first main pads MPD1, the second main pad MPD2, and the third main pad MPD3 may be secured. Contact failure between the first main pads MPD1, the second main pad MPD2, and the third main pad MPD3 may be reduced or prevented.

Although certain embodiments and implementations have been described herein, other embodiments and modifications will be apparent from this description. Accordingly, the inventive concepts are not necessarily limited to such embodiments, but rather to the broader scope of the appended claims and various obvious modifications and equivalent arrangements as would be apparent to a person of ordinary skill in the art.

What is claimed is:

1. A circuit board assembly comprising a main board and a connection board attached to the main board, wherein the connection board includes:
   a base board including a connecting pad area and a mounting area, wherein the connection board is attached to the main board in the connecting pad area, and wherein the mounting area is spaced apart from the connecting pad area in a first direction and includes a driving chip mounted thereon;
   first connection pads disposed on the connecting pad area of the base board; and
   second connection pads disposed on the connecting pad area of the base board, and
   wherein the main board includes:
   first main pads connected to the first connection pads in a one-to-one connection; and
   a second main pad connected to the second connection pads in a many-to-one connection.

2. The circuit board assembly of claim 1, wherein the second connection pads are disposed adjacent to each other.

3. The circuit board assembly of claim 1, wherein there are 2 to 4 second connection pads.

4. The circuit board assembly of claim 1, wherein each of the second connection pads receives a same signal from the second main pad.

5. The circuit board assembly of claim 4, wherein the signal is a ground.

6. The circuit board assembly of claim 5, wherein the second connection pads include a VSS pad and a test pad.

7. The circuit board assembly of claim 4, wherein the signal is a contact resistance measurement signal.

8. The circuit board assembly of claim 4, wherein the signal is a repair signal.

9. The circuit board assembly of claim 4, wherein the signal is a data signal or a gate signal.

10. The circuit board assembly of claim 1, wherein the connection board further includes third connection pads disposed on the connecting pad area of the base board, and
   wherein the main board further includes a third main pad connected to the third connection pads in a many-to-one connection.

11. The circuit board assembly of claim 10, wherein the second main pad and the third main pad are disposed adjacent to each other in a second direction that is perpendicular to the first direction.

12. The circuit board assembly of claim 10, wherein at least one of the first main pads is disposed between the second main pad and the third main pad.

13. The circuit board assembly of claim 1, wherein a length of each of the first main pads in the first direction is a same as a length of the second main pad in the first direction.

14. The circuit board assembly of claim 1, wherein a thickness of each of the first main pads in a vertical direction is a same as a thickness of the second main pad in the vertical direction.

15. The circuit board assembly of claim 1, wherein the connection board further includes connection lines disposed on the base board, and wherein the connection lines electrically connect each of the first and second connection pads to the driving chip.

16. The circuit board assembly of claim 1, wherein the first connection pads are arranged in a second direction perpendicular to the first direction to define a pad row.

17. The circuit board assembly of claim 16, wherein the second connection pads are arranged in the first direction within the pad row.

18. A display device comprising a display panel, a main board, and a connection board attached to the display panel and the main board,
   wherein the connection board includes:
   a base board including a first connecting pad area, a second connecting pad area, and a mounting area, wherein the connection board is attached to the main board in the first connecting pad area, wherein the connection board is attached to the display panel in the second connecting pad area, and wherein the mounting area is disposed between the first connecting pad area and the second connecting pad area and includes a driving chip mounted thereon;
   first connection pads disposed on the first connecting pad area of the base board; and second connection pads disposed on the first connecting pad area of the base board, and wherein the main board includes:
first main pads connected to the first connection pads in a one-to-one connection;
a second main pad connected to the second connection pads in a many-to-one connection.

19. The display device of claim 18, wherein the second connection pads are disposed adjacent to each other.

20. The display device of claim 18, wherein the second connection pads receive a same signal from the second main pad.

* * * * *